United States Patent
Ginsburg et al.

(10) Patent No.: US 7,299,529 B2
(45) Date of Patent: Nov. 27, 2007

(54) FILM BULK ACOUSTIC RESONATOR (FBAR) PROCESS USING SINGLE-STEP RESONATOR LAYER DEPOSITION

(75) Inventors: Eyal Ginsburg, Tel-Aviv (IL); Dora Etgar-Diamant, Modiin (IL); Li-Peng Wang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 11/154,854

(22) Filed: Jun. 16, 2005

(65) Prior Publication Data

US 2006/0284706 A1 Dec. 21, 2006

(51) Int. Cl.
*H04R 17/00* (2006.01)
*H03H 9/00* (2006.01)

(52) U.S. Cl. .......... 29/25.35; 29/830; 29/831; 29/832; 29/835; 29/844; 29/847; 333/187

(58) Field of Classification Search .......... 29/25.35, 29/832, 835, 844, 847, 831, 830; 333/189, 333/188, 187, 190; 310/313 R, 313 A, 363, 310/328, 349, 324; 216/100, 95; 427/100
See application file for complete search history.

(56) References Cited

U.S. PATENT DOCUMENTS

| | | | | |
|---|---|---|---|---|
| 5,696,423 A | * | 12/1997 | Dydyk et al. ........... | 310/346 |
| 6,242,843 B1 | * | 6/2001 | Pohjonen et al. ....... | 310/313 R |
| 6,307,447 B1 | * | 10/2001 | Barber et al. ............ | 333/189 |
| 6,384,697 B1 | * | 5/2002 | Ruby ....................... | 333/189 |
| 6,437,484 B1 | * | 8/2002 | Nishimura et al. ...... | 310/324 |

* cited by examiner

*Primary Examiner*—A. Dexter Tugbang
*Assistant Examiner*—Tai Van Nguyen
(74) *Attorney, Agent, or Firm*—Blakely, Sokoloff, Taylor & Zafman LLP

(57) ABSTRACT

A process comprising, in a vacuum, depositing a bottom electrode layer and a piezoelectric layer over a cavity in a substrate, the cavity being filled with a sacrificial material, patterning and etching the piezoelectric layer and the bottom electrode layer to expose one or more edges of the bottom electrode layer and the piezoelectric layer, treating some or all of the one or more edges to prevent electrical contact between the bottom electrode layer and a top electrode layer, and depositing and etching the top electrode layer. An apparatus comprising a resonator attached to a substrate and suspended over a cavity in the substrate, the resonator comprising a bottom electrode layer and a piezoelectric layer on the bottom electrode layer, both the bottom electrode layer and the piezoelectric layer having been deposited in a vacuum, and a top electrode layer on the piezoelectric layer, wherein one or more edges of the bottom electrode layer and the piezoelectric layer include features that prevent electrical contact between the bottom electrode layer and the top electrode layer.

6 Claims, 4 Drawing Sheets

FILM BULK ACOUSTIC RESONATOR (FBAR) PROCESS USING SINGLE-STEP RESONATOR LAYER DEPOSITION

TECHNICAL FIELD

The present invention relates generally to film bulk acoustic resonators (FBARs) and in particular, but not exclusively, to FBARs in which some of the resonator layers are deposited in a single step.

BACKGROUND

Film Bulk Acoustic Resonators—commonly known as FBARs—are used in a variety of applications, for example as radio frequency (RF) filters in wireless communication systems. In a typical membrane-type FBAR, the membrane is made up of a piezoelectric material sandwiched between a pair of electrodes. A voltage applied across the pair of electrodes causes the piezoelectric material to vibrate. The frequency of the first fundamental mode of a FBAR is determined by the thickness of the resonator's film stack, which is equal to the corresponding half-wavelength. RF FBAR filter is generally consisting two set frequencies of FBAR resonators.

During operation, how well a particular FBAR performs its function is related to the quality of the materials that make up the FBAR. In membrane-type FBARs, resonant properties are sensitive to the quality of the piezoelectric material sandwiched between the pair of electrodes. Currently, FBARs are manufactured by first depositing, patterning and etching a bottom electrode, then depositing the piezoelectric material on the already-etched bottom electrode and patterning and etching it, and finally depositing, patterning and etching of the top electrode.

Among other shortcomings, the current process for making FBARs significantly degrades the quality of the piezoelectric layer in the resonator. Patterning and etching the bottom electrode causes its surface to be irregular and rough. Depositing the piezoelectric material on such a rough surface distorts the orientation of crystals in the piezoelectric material, which can significantly degrade its quality. Moreover, the patterning and etching of the bottom electrode, which expose its surface to air, cause oxides and other substances to build up on its surface before the piezoelectric material is deposited. These oxides and other substances can also affect the quality of the piezoelectric layer.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. Drawings are not to scale unless otherwise indicated.

DETAILED DESCRIPTION OF THE ILLUSTRATED EMBODIMENTS

Embodiments of a process, apparatus and system for building and using film bulk acoustic resonators (FBARs) are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
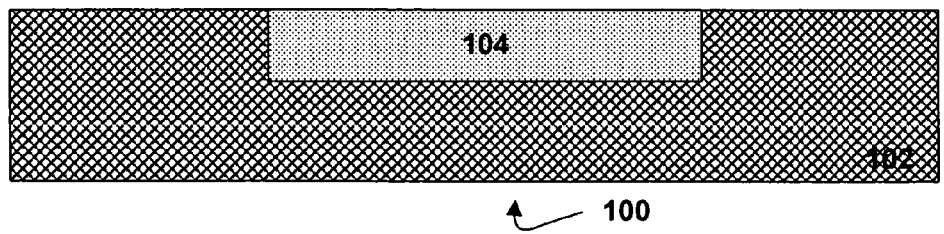
FIG. 1 is a side elevation of an embodiment of a substrate having a cavity filled with a sacrificial material.

FIG. 1 illustrates an embodiment of a base 100 on which a film bulk acoustic resonator (FBAR) can be built. The base 100 includes a substrate 102 having a cavity etched or otherwise created in one side. The cavity is filled with a sacrificial material 104. In one embodiment the substrate 102 is made of silicon, although in other embodiments the substrate can be made of other materials such as silicon compounds, combinations of silicon and other materials, or other materials altogether. Moreover, although the substrate 102 is shown in the figure as a monolithic substrate made up of a single material, in other embodiments the substrate can be a composite substrate made up of layers of different materials such as dielectrics, conductors and semiconductors.

The sacrificial material 104 supports the construction of an FBAR on the substrate 102 but will later be removed through etching, leaving an FBAR resonator suspended over a cavity that allows the FBAR to vibrate freely. In one embodiment, the sacrificial material is a silicon compound such as silicon oxide, but in other embodiments the sacrificial material can be a different silicon compound, combinations of silicon and other materials, or other materials altogether. Moreover, although the sacrificial material 104 is shown in the figure as a single material, in other embodiments the sacrificial material can be made up of layers of different materials such as phosphorous silicon glass (PSG), dielectrics, metals, etc.

Figure 2:
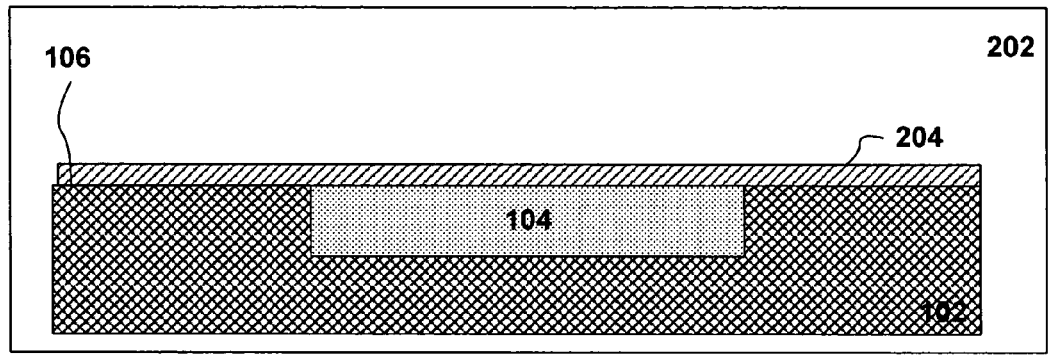
FIG. 2 is a side elevation of a vacuum chamber in which the embodiment of a substrate of FIG. 1 is placed and in which a bottom electrode layer is deposited on the substrate.
Figure 3:
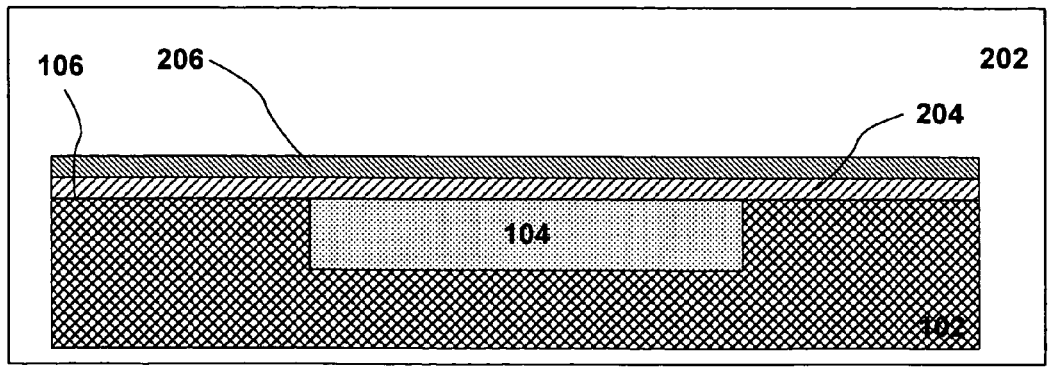
FIG. 3 is a side elevation of a vacuum chamber in which the embodiment of a substrate of FIG. 2 is placed and in which a piezoelectric layer is deposited on the bottom electrode layer.

FIGS. 2 and 3 illustrate an embodiment of a process for depositing a bottom electrode layer and a piezoelectric layer on the substrate 102 and sacrificial material 104 to begin forming an FBAR. FIG. 2 illustrates the deposition of the bottom electrode layer. The substrate 102 and the sacrificial material 104 are first inserted in a vacuum chamber 202. Air is removed from the vacuum chamber and, while under vacuum conditions, a bottom electrode layer 204 is then deposited onto the surface 106 of the substrate and sacrificial material. The bottom electrode layer 204 is made of a conductor. In one embodiment the bottom electrode layer 204 is made of a metal such as molybdenum (Mo), but in other embodiments other metallic or non-metallic conductors can be used. Although not shown, in other embodiments other layers of material can be deposited on the substrate prior to deposition of the electrode layer, for example to electrically insulate the bottom electrode from the substrate or to promote adhesion of the bottom electrode layer to the substrate. In the embodiment shown, the bottom electrode layer 204 is deposited by sputtering, which is an example of a physical vapor deposition (PVD) method, but in other embodiments the bottom electrode layer can be deposited on the substrate by various methods known in the art including, for example, chemical vapor deposition (CVD).

FIG. 3 illustrates the deposition of the piezoelectric layer. After the bottom electrode 204 is in place, and while the deposition is still under vacuum in the vacuum chamber 202, a piezoelectric layer 206 is deposited on top of the bottom electrode layer 204. In one embodiment, the piezoelectric layer 206 is made up of aluminum nitride (AlN), but in other embodiments the piezoelectric layer 206 can be made of other materials or combinations of materials. Like the bottom electrode layer 204, in the embodiment shown, the piezoelectric layer 206 is deposited by sputtering, which is an example of a physical vapor deposition (PVD) method, but in other embodiments the bottom electrode layer can be deposited on the substrate by various methods known in the art including, for example, chemical vapor deposition (CVD).

Figure 4:
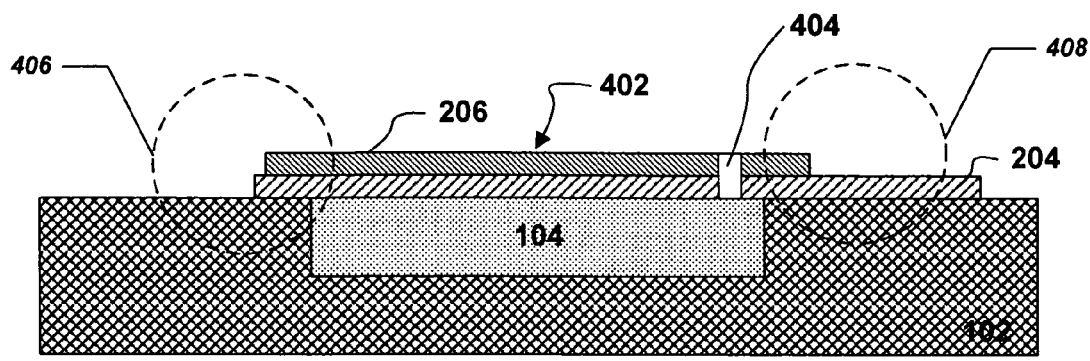
FIG. 4 is a side elevation showing the substrate with an embodiment of a partially complete FBAR resonator including a bottom electrode and a piezoelectric layer deposited thereon.

FIG. 4 illustrates the structure that results after patterning and etching of the bottom electrode layer 204 and the piezoelectric layer 206. Starting with the structure substantially as it appears in FIG. 3, appropriate patterning and etching is applied to the structure. By patterning and etching, excess portions of the bottom electrode layer and the piezoelectric layer are removed, leaving a partially complete FBAR resonator 402. This stage of patterning and etching is also used to create one or more release holes 404 extending through the bottom electrode layer 204 and the piezoelectric layer 206. The release holes 404 will allow etchants to reach and remove the sacrificial material 104 when the time comes to release the FBAR resonator prior to operation.

At this stage the partially complete FBAR resonator 402 is only partially complete because a top electrode layer has not yet been deposited, patterned and etched. Before the top electrode layer can be put in place, the sides or edges of the partially complete FBAR 402 must be treated to prevent electrical contact between the bottom electrode and the top electrode; such electrical contact between the top and bottom electrodes would cause a short circuit that, at a minimum, could cause the FBAR to malfunction. The type of treatment applied to the edges of the partially complete FBAR resonator 402 depends on the configuration of the edge. One edge configuration, shown within circle 406, occurs when the edge of bottom electrode layer 204 is approximately flush with the edge of the piezoelectric layer 206 deposited on top of it. Another edge configuration, shown within circle 408, occurs when the bottom electrode layer 204 projects out from beneath the piezoelectric layer 206. The edges around the entire perimeter of the partially complete resonator 402 can include one or both of the edge configurations 406 and 408.

Figure 5:
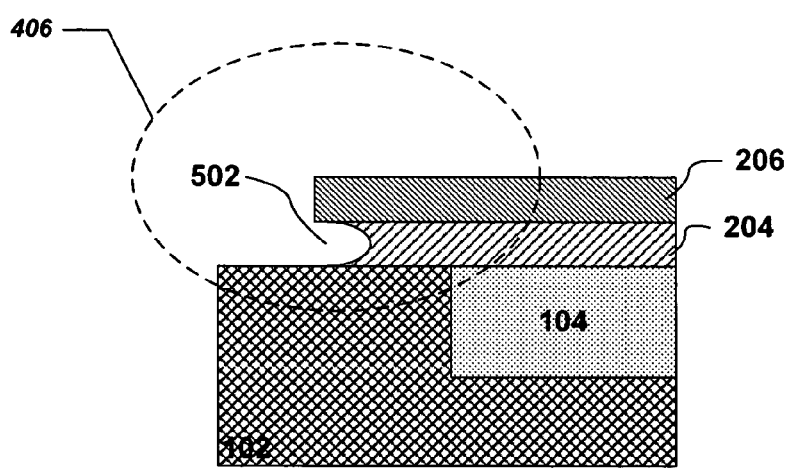
FIG. 5 is a an enlarged side elevation of an edge portion of the embodiment of a partially complete FBAR resonator showing an embodiment of a treatment that can be applied to all or part of the perimeter of the partially assembled FBAR resonator.
Figure 6:
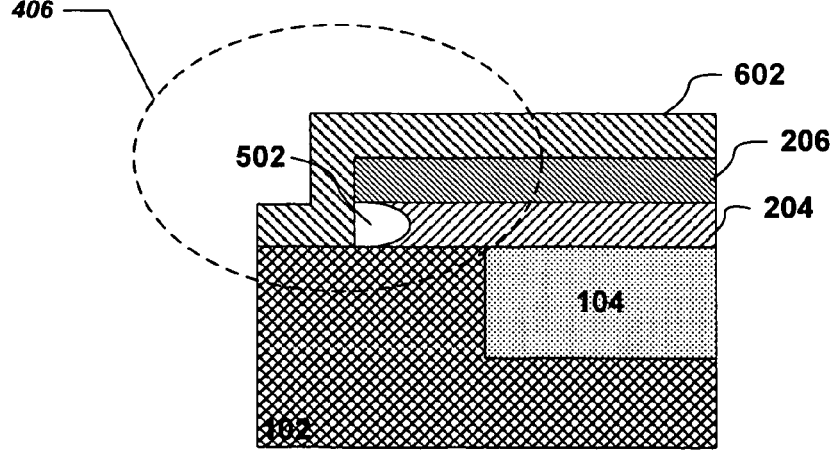
FIG. 6 is an enlarged side elevation of an edge portion of the embodiment of a partially complete FBAR resonator with the embodiment of a treatment shown in FIG. 5, illustrating completion of the resonator by application of a top electrode.

FIGS. 5 and 6 illustrate an embodiment of an edge treatment for use with the edge configuration 406 in FIG. 4. In this edge treatment, wet etching is used to etch the bottom electrode layer 204 until its edge recedes underneath the edge of the piezoelectric layer 206, creating an "undercut" 502. With the undercut 502 formed, the edge of the piezoelectric layer 206 overhangs the edge of the bottom electrode layer 204 and shields it from materials deposited from above. FIG. 6 illustrates an edge 406 of an FBAR resonator treated as shown in FIG. 5 after deposition of the top electrode layer 602. In one embodiment the top electrode is made of a metal such as molybdenum (Mo), but in other embodiments other metallic or non-metallic conductors can be used. In addition, although in the embodiment shown the top electrode layer 602 and the bottom electrode layer 204 are made of the same material, in other embodiments the top and bottom electrode layers need not be of the same material. With the undercut 502 in place, the top electrode layer 602 can be deposited on the FBAR without coming into electrical contact with the bottom layer 204.

Figure 7:
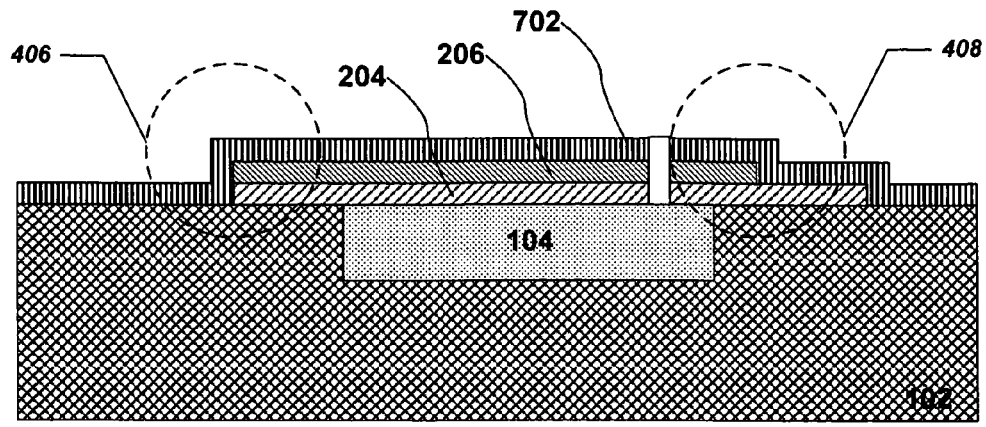
FIGS. 7-9 are side elevations of a partially complete FBAR resonator, showing an alternative embodiment of a treatment that can be applied to all or part of the perimeter of the partially complete FBAR resonator.
Figure 8:
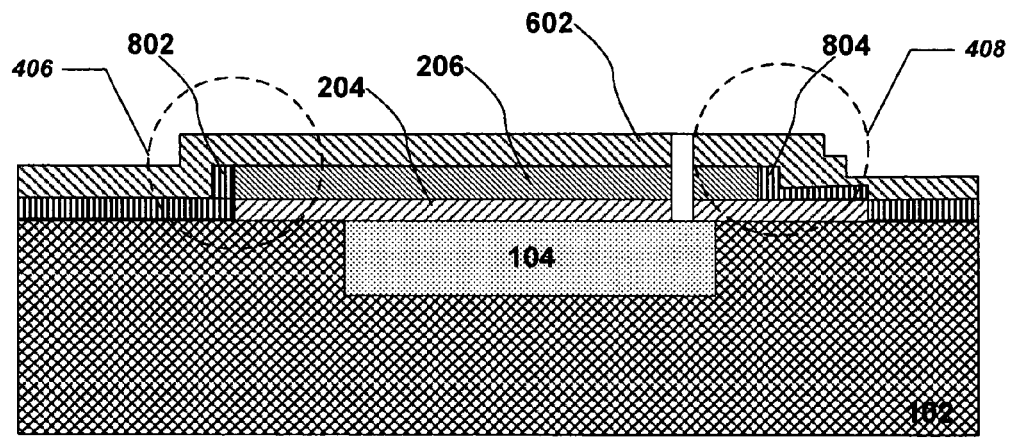

FIGS. 7 and 8 illustrate an alternative embodiment of an edge treatment for use with both edge configurations shown within circles 406 and 408 in FIG. 4. FIG. 7 illustrates the first part of the process, in which an electrically insulating layer 702 is deposited on the substrate 102, the lower electrode layer 204 and the piezoelectric layer 206. In one embodiment, the electrically insulating layer 702 can be aluminum nitride (AlN), but in other embodiments other types of electrically insulating materials can be used.

FIG. 8 illustrates the patterning and etching of the electrically insulating layer 702 and the deposition of the top electrode layer 602. Following deposition of the electrically insulating layer 702, it is etched to, among other things, expose the top surface of the piezoelectric layer 206. Parts of the electrically insulating layer 207, however, are left behind along the edges of the lower electrode layer 204 and the piezoelectric layer 206: portion 802 of the electrically insulating layer remains along edge 406, while portion 804 remains along edge 408. The portions 802 and 804 of the insulating layer that remain along the edges prevent the top electrode layer 602, when deposited and etched, from coming into contact with the bottom electrode layer 204.

Figure 9:
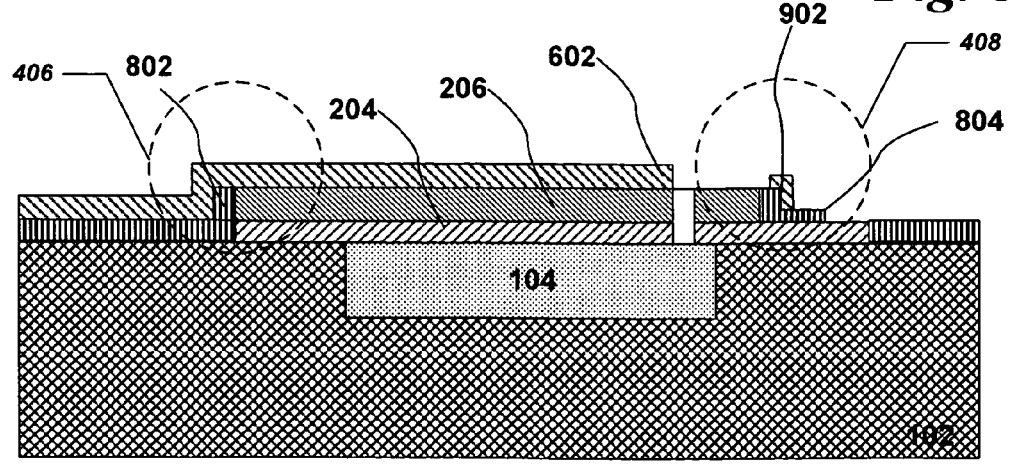

FIG. 9 illustrates the patterning and etching of the top electrode layer 602, thus essentially completing the resonator. After patterning and etching, the top electrode layer 602 is substantially removed from the edge 408, although small portions of the top electrode layer 602, such as portion 902, may remain on the insulating layer portion 804. Thus, at edge 408 the remaining portion 804 of the insulating layer 702 prevents contact between the top electrode and the bottom electrode. At edge 406, the top electrode layer 602 remains in place, but it is separated from the bottom electrode 204 by the insulating layer portion 802.

Figure 10:
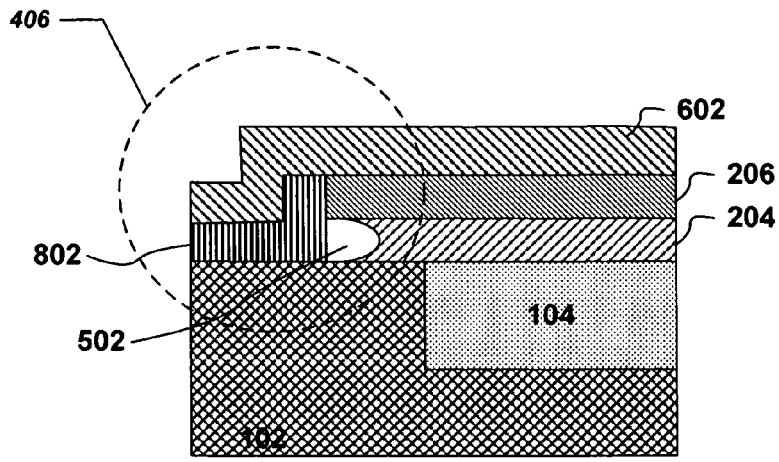
FIG. 10 is a side elevation showing yet another alternative embodiment of a treatment that can be applied to all or part of the perimeter of the partially complete piezoelectric membrane.

FIG. 10 illustrates another alternative embodiment of an edge treatment that essentially combines the two embodiments of edge treatments discussed above for an edge such as edge 406. In other words, in the edge 406 the bottom electrode layer 204 is first etched to create the undercut 502, and the electrically insulating layer 702 and the top electrode layer 602 are deposited and etched as shown in FIGS. 7-9.

Figure 11:
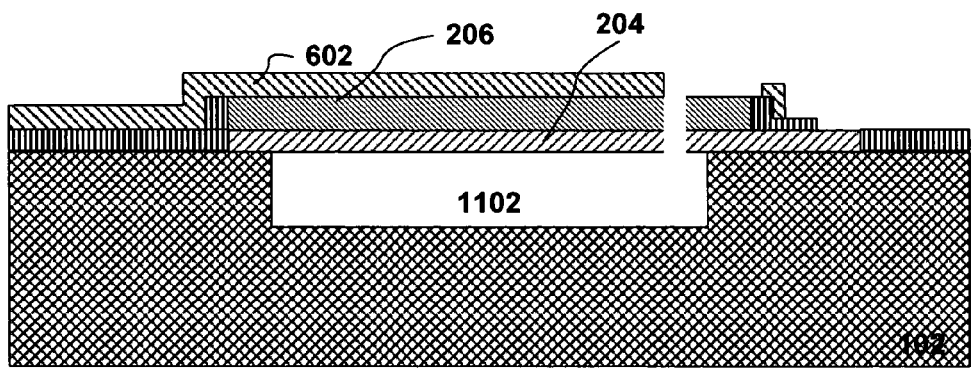
FIG. 11 is a side elevation of a completed embodiment of an FBAR.

FIG. 11 illustrates the last step in the completion of the FBAR. Following deposition, patterning and etching of the top electrode layer as shown in FIGS. 8 and 9, the FBAR resonator is complete and the sacrificial material 104 can be removed from the cavity in the substrate 102. With the sacrificial material 104 removed, an air space 1102 is left behind so that the FBAR resonator can freely vibrate in response to a signal applied to the FBAR via the top and bottom electrodes.

Figure 12:
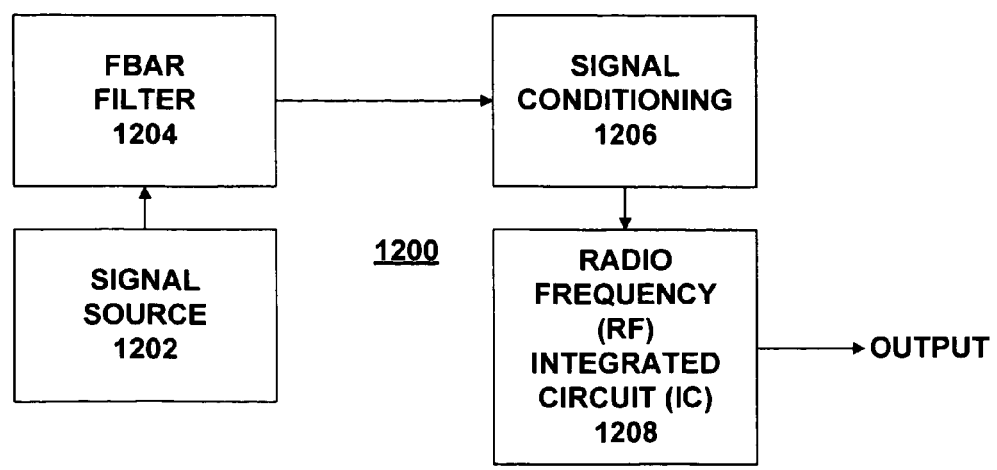
FIG. 12 is a block diagram of an embodiment of a system including an embodiment of an FBAR constructed according to the present invention.

FIG. 12 illustrates an embodiment of a system 1200 including an FBAR filter 1204. In one embodiment, the FBAR filter 1204 includes a pair of FBARs built according to the embodiments described above. The system 1200 includes a signal source 1202 coupled to the FBAR filter 1204. In one embodiment, the signal source could be an antenna receiving a signal from a wireless telecommunication network, but in other embodiments could be something else. The FBAR filter 1204 outputs an RF signal with the desired frequency response to signal conditioning unit 1206, which in one embodiment is a low-noise amlpifier but in other embodiments can included additional or different elements. The signal conditioning unit 1206 is coupled to a radio frequency (RF) integrated circuit (IC) 1208 which, in one embodiment, can be a cellular radio of the kind found in cellular communication devices. The radio frequency integrated circuit 1208 processes the signal received from the signal conditioning unit 1206 and outputs a signal to, in one embodiment, a speaker in a cellular communication device such as a cellular telephone.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A process comprising:
   in a vacuum, depositing a bottom electrode layer and a piezoelectric layer over a cavity in a substrate, the cavity being filled with a sacrificial material, and depositing a piezoelectric layer over the bottom electrode layer, wherein said depositing of the bottom electode layer and depositing of the piezoelectric layer is still under said vacuum;
   patterning and etching the piezoelectric layer and the bottom electrode layer to expose one or more edges of the bottom electrode layer and the piezoelectric layer;
   treating at least one of the one or more edges to prevent electrical contact between the bottom electrode layer and a top electrode layer; and
   depositing and etching the top electrode layer.

2. The process of claim 1 wherein treating at least one of the exposed edges comprises etching the bottom electrode layer until it undercuts below the piezoelectric layer.

3. The process of claim 2 wherein etching the bottom electrode layer comprises wet etching.

4. The process of claim 1 wherein treating at least one of the exposed edges comprises:
   depositing an electrically insulating layer on the piezoelectric layer and the substrate; and
   patterning and etching the electrically insulating layer to leave portions of the electrically insulating layer covering the edges.

5. The process of claim 1 wherein treating at least one of the exposed edges comprises:
   etching the bottom electrode layer until it undercuts below the piezoelectric layer;
   depositing an electrically insulating layer on the piezoelectric layer and the substrate; and
   patterning and etching the electrically insulating layer to leave portions of the electrically insulating layer covering the edges.

6. The process of claim 1, further comprising removing the sacrificial material to release the piezoelectric membrane.

* * * * *